United States Patent [19]

Felix et al.

[11] 4,311,906

[45] Jan. 19, 1982

[54] MOSAIC OF RADIATION DETECTORS READ BY A SEMICONDUCTOR DEVICE AND A PICTURE PICKUP SYSTEM COMPRISING A MOSAIC OF THIS TYPE

[75] Inventors: Pierre Félix; Guy Le Parquier, both of Paris, France

[73] Assignee: Thomson-CSF, Paris, France

[21] Appl. No.: 162,653

[22] Filed: Jun. 24, 1980

[30] Foreign Application Priority Data

Jun. 27, 1979 [FR] France .................. 79 16560

[51] Int. Cl.³ .................... G01J 1/00; G01T 1/22
[52] U.S. Cl. ........................ 250/349; 250/370
[58] Field of Search .................. 250/338, 340, 349; 357/29, 30, 32

[56] References Cited

U.S. PATENT DOCUMENTS 3,973,146  8/1976  Arnold et al. .................. 357/32 X

FOREIGN PATENT DOCUMENTS 1258572  12/1971  United Kingdom .

OTHER PUBLICATIONS

"Application of Charge-Coupled Devices to Infrared Detection and Imaging," Proceedings of the IEEE, vol. 63, No. 1, Jan. 1975, pp. 67-74, Steckl et al.

*Primary Examiner*—Davis L. Willis
*Attorney, Agent, or Firm*—Roland Plottel

[57] ABSTRACT

Electrical signals delivered by detectors at the surface of a first high-capacitance insulating layer which provides a separation between a first array of metallic electrodes and the detectors are collected by the electrodes by capacitive coupling. The first array of electrodes is electrically connected to a second array of electrodes having smaller dimensions. The two arrays are separated by a second insulating layer and the second array is located at the interface between the second insulating layer and the oxide layer which covers the semiconductor readout substrate.

17 Claims, 14 Drawing Figures

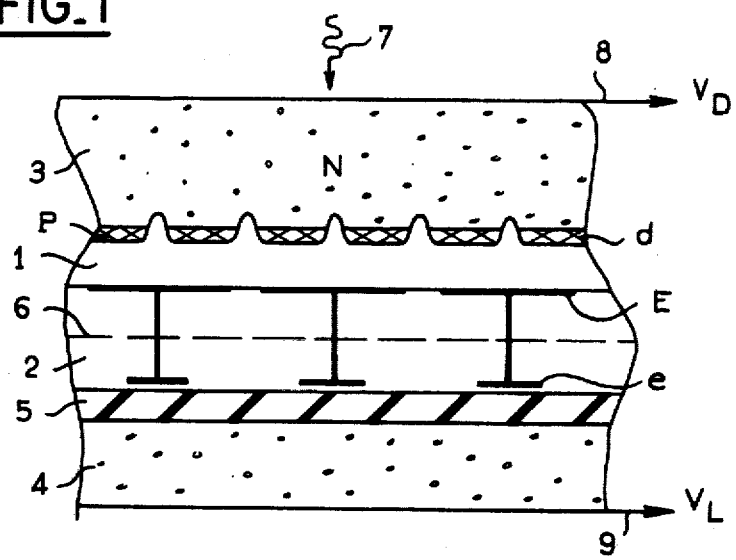
FIG._1
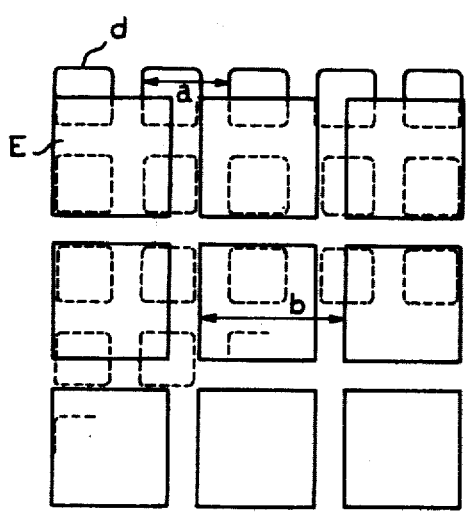
FIG._2
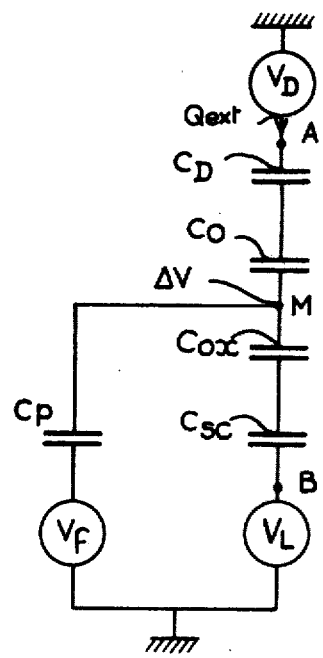
FIG._3

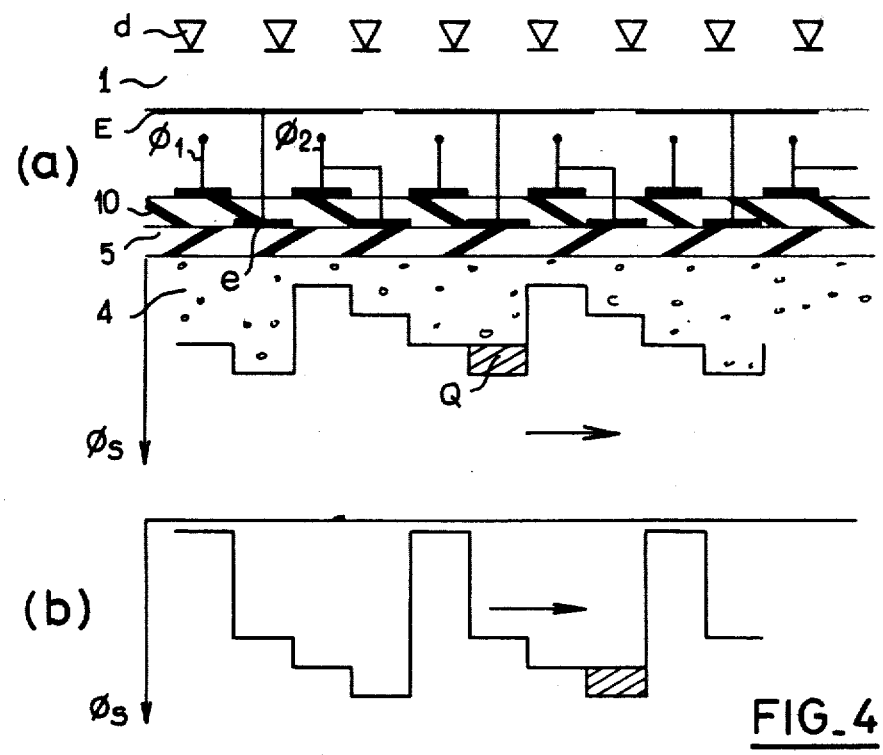
FIG._4
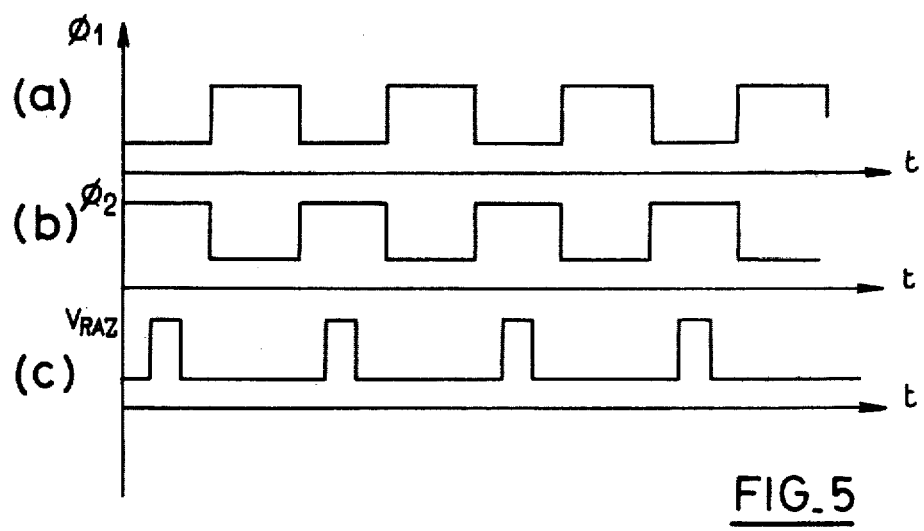
FIG._5

MOSAIC OF RADIATION DETECTORS READ BY A SEMICONDUCTOR DEVICE AND A PICTURE PICKUP SYSTEM COMPRISING A MOSAIC OF THIS TYPE

This invention relates to a mosaic of radiation detectors read by a semiconductor device. The invention is also concerned with a picture pickup system equipped with a mosaic of this type.

Mosaics of electromagnetic radiation detectors are already known in the prior art. As a general rule, a mosaic of this type consists of an array of detectors formed of pyroelectric material or of junctions formed on a semiconductor substrate. Another type of mosaic which is also known is formed solely of a wafer of pyroelectric material.

The array of detectors is exposed to electromagnetic radiation such as infrared radiation, for example, and an electrical readout or sense signal is collected from each detector. Said readout signal can be collected by means of an electron beam or by means of a semiconductor device, thus providing the advantageous possibility of reducing the bulk of the picture pickup system which is equipped with the mosaic.

The invention relates to a mosaic of detectors which are read by means of a semiconductor device.

The problem presented by this application lies in the electrical coupling and mechanical coupling between the detection and readout portions, that is, between the mosaic of detectors and the semiconductor readout device.

It is necessary on the one hand to collect from the readout portion an electrical signal corresponding to the signal generated in the detection portion by the electromagnetic radiation with a signal-to-noise ratio which is as high as possible: this is the problem of electrical coupling.

It is necessary on the other hand to join the detection and readout portions together while reducing thermal leakages between the two portions and at the same time permitting thermal expansion of the detection and readout substrates which are often different: this is the problem of mechanical coupling.

The present invention provides a simple and effective solution to the problems of electrical and mechanical couplings of the detection and readout portions.

In accordance with the invention, a first insulating layer having a high capacitance per unit area provides a separation between the mosaic surface on which the detectors are formed and the oxide layer which covers the semiconductor substrate of the readout device. Finally, a first array of metallic electrodes collects by capacitive coupling the electrical signals delivered by the detectors at the surface of the first insulating layer on the side corresponding to the readout device.

Other features of the invention will be more apparent upon consideration of the following description which is given by way of example and not in any limiting sense, reference being made to the accompanying drawings in which:

FIG. 1 is a transverse sectional view of one embodiment of a mosaic in accordance with the invention;

FIG. 2 is a top view illustrating a detail of FIG. 1;

FIG. 3 is a circuit diagram equivalent to each elementary point of the mosaic of FIG. 1;

FIGS. 4a and 4b show respectively one embodiment of a mosaic in accordance with the invention and a schematic diagram which serves to explain the operation of this embodiment;

FIGS. 5a to 5c are diagrams of signals which can be applied to the mosaic of FIG. 4a;

FIGS. 6a, 6b and 7 show one mode of current readout of the mosaic shown in FIG. 4a;

FIG. 8 shows one mode of voltage readout of the mosaic shown in FIG. 4a;

In the different figures, the same references designate the same elements but it will be apparent that the dimensions and proportions of the different elements have not been observed for reasons of enhanced clarity.

Figure 6:
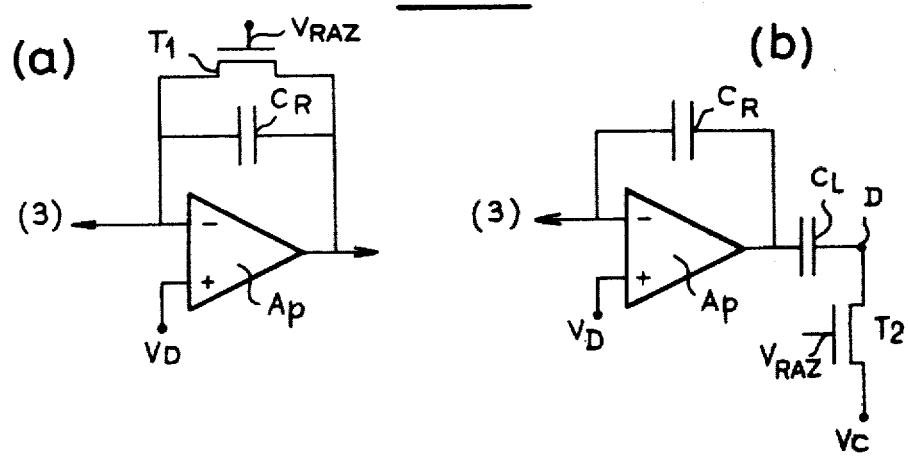

In the embodiment of a mosaic which is illustrated by way of example in FIG. 1, the detectors d are mesa-structure pn junctions formed on a semiconductor substrate 3. The detectors can also be constituted by Schottky diodes and can have either a mesa or planar structure. The mosaic can also be constituted in known manner by a continuous layer of semiconductor material in which the detectors are induced in the form of potential wells. Said layer is provided with an insulating layer and with signal-collecting electrodes which have a special geometry and composition.

The electromagnetic radiation applied to the mosaic of detectors usually comes from the side of the substrate opposite to the side which carries the detectors, as indicated by the wavy arrow 7. In order to ensure practically complete absorption of the electromagnetic radiation in the vicinity of the detectors, the substrate of the mosaic is either given a small thickness or else chosen so as to be lightly doped and to have a well-determined width of forbidden band.

Thus in the case of detection of infrared radiation, for example, the substrate of the mosaic of detectors can be constituted by a semiconductor having a narrow forbidden-band width such as lead sulphide PbS, lead selenide PbSe or lead telluride PbTe. It is also possible to employ ternary compounds such as lead and tin telluride PbSnTe or mercury and cadmium telluride HgCdTe. In order to reduce absorption of radiation by the substrate of the mosaic, it is possible to employ a substrate consisting of two portions, namely a first portion of semiconductor material having a narrow forbidden-band width on which the junctions are formed, and a second portion covering the first, also of semiconductor material and having a higher forbidden-band width. In this case, the photons collected are limited to those having an energy range between the two forbidden-band widths. Thus, again in the case of infrared radiation detection, the detectors can be fabricated from lead and tin telluride PbSnTe covered with a layer of lead telluride PbTe.

It has been noted earlier that the detectors could consist of pyroelectric material and that the mosaic of detectors could consist solely of a plate of pyroelectric material. In accordance with customary practice, the pyroelectric material consists of lithium tantalate LiTaO$_3$ or triglycine sulphate (TGS) and its derivatives.

The semiconductor readout device is formed on a semiconductor substrate 4 which is separate and distinct from the substrate provided for the mosaic of detectors. Said semiconductor substrate 4 is covered with an oxide layer 5. Silicon covered with a layer of silica is usually employed for the readout operation.

The mosaic in accordance with the invention is also capable of operating when the electromagnetic radiation arrives at the detectors via the semiconductor readout device.

In accordance with the invention, a first insulating layer 1 having a high capacitance per unit area provides a separation between that surface of the mosaic on which the detectors d are formed and the oxide layer of the semiconductor substrate.

It is also advantageous to ensure that said first insulating layer ensures very low thermal conductance between the detection and readout portions and permits matching of the coefficients of expansion of the detection and readout substrates which are often different. This is achieved when said first insulating layer is a vacuum layer having a thickness of 1 micron, for example. In order to ensure matching of the coefficients of expansion of the substrates, it is also possible to employ a plastic dielectric such as a polymer film.

A first array of metallic electrodes E collects by capacitive coupling the electrical signals delivered by the detectors d at the surface of the first insulating layer 1 on the same side as the readout device.

In the embodiment of the invention which is illustrated in FIG. 1, there is shown a second array of metallic electrodes e which is separated from the first by a second insulating layer 2 and which is located at the interface between the second insulating layer and the oxide layer 5. Each electrode of the second array is connected electrically to one electrode of the array which is located opposite and has larger dimensions. These two arrays of electrodes which are connected to each other serve to reduce the surface area of the electrodes e in the readout device which is intended to consist of a large number of elements while ensuring that the electrodes employed for collecting the signal E have a large surface area.

The second insulating layer 2 can be formed of the same material as the first insulating layer 1.

In the embodiment shown in FIG. 1, a metallic screen 6 which is brought to a fixed potential $V_f$ is inserted in the second insulating layer 2. This screen serves to provide electrical insulation of the detection portion from the parasitic signals emitted by the readout portion.

Leads 8 and 9 are usually connected to the detection substrate 3 and to the readout substrate 4. As a general rule, these leads serve to apply bias voltages $V_D$ and $V_L$ to said substrates.

FIG. 2 is a top view which illustrates a detail of FIG. 1. There are shown in FIG. 2 the position and respective dimensions of the first array of electrodes E and of the array of detectors d. The metallic electrodes of the first array E can be deposited by evaporation directly on either the first or the second insulating layer. The elementary pitch b of said electrodes corresponding to the spatial resolution in the picture pickup system equipped with the mosaic is greater than the elementary pitch a of the detectors d. This configuration does not entail the need for any registering of the detectors d with respect to the first array of electrodes E which serves to collect the signal from the detectors. The operation of the mosaic in accordance with the invention will therefore not be disturbed by any displacement of the array of detectors or of the first array of electrodes under the action of differential expansion, for example.

FIG. 3 is an electric circuit diagram equivalent to each elementary point of the mosaic shown in FIG. 1, namely to the surface of an electrode E of the first array.

This equivalent circuit diagram comprises four capacitances in series between a point A and a point B. There are shown in succession:

a capacitance $C_D$ representing the capacitance of the detectors relative to an elementary point of resolution;

a capacitance $C_O$ representing the capacitance relative to the same surface of the first insulating layer 1 which has a high value of capacitance;

the capacitance $C_{OX}$ representing the capacitance of the oxide layer 5 which covers the semiconductor substrate 4 of the readout device and relative to the surface of one electrode e of the second array;

the capacitance $C_{SC}$ representing the depletion capacitance within the semiconductor 4 of the readout device and again relative to the surface of one electrode e of the second array.

A direct-current voltage source which delivers the voltage $V_D$ is usually connected between the point A and ground. A direct-current voltage source which delivers the voltage $V_L$ is usually connected between the point B and ground.

Between the point M which is common to the capacitances $C_O$ and $C_{OX}$, and ground, there is shown the stray capacitance $C_P$ which is caused by the fixed screen and the direct-current voltage source $V_f$ which biases said screen.

Consideration will now be given to the operation of the mosaic according to the invention in the case in which the detectors are constituted by junctions and then in the case in which the detectors are of pyroelectric material (or when the mosaic is constituted by a strip of pyroelectric material).

In the case in which the detectors are constituted by junctions, the semiconductor readout device performs the following successive operations in the case of each junction:

during a first step, reverse-biasing of the junction during which integration of the radiation received by this latter takes place during the integration time interval $t_i$;

during a second step, forward-biasing of the junction during which the charges generated optically and stored during the integration time interval $t_i$ within the junction are reinjected into the detection substrate 3.

In the case of detection by pyroelectric material, the semiconductor readout device carries out the following successive operations:

during a first step, integration of the radiation received by the pyroelectric material whose potential is allowed to remain floating during the integration time interval $t_i$;

during a second step, the potential which has previously been allowed to remain floating is stabilized at a reference potential.

If the reference $Q_D$ designates the quantity of charges generated optically by the detectors corresponding to an elementary point during the integration time interval $t_i$, the variation in potential induced on each electrode E of the first array and therefore at the point M of FIG. 3 is written:

$$\Delta V = \frac{Q_D}{C_D} \cdot \frac{1/C}{1/C_O + 1/C_D + 1/C}$$

with $C = C_p + 1/(1/C_{OX} + 1/C_{SC})$.

In practice, $C_D$ varies from 30 to 1000 nF/cm² in the case of junction detectors and from 0.1 to 10 nF/cm² in the case of pyroelectric detectors and $C_O$ is typically 1 nF/cm², which corresponds to approximately 1 micron of vacuum, whilst $C_{OX}$ is of the order of 30 nF/cm², which corresponds to 1200 Å of silica and $C_{SC}$ is of the order of 5 nF/cm².

In the case of values of $C_D$ which are higher than 30 nF/cm² we have approximately:

$$\Delta V = \frac{C_O}{C} \cdot \frac{Q_D}{C_D} \simeq 0.2 \cdot \frac{C_D}{C_D}.$$

When carrying out a voltage readout by measuring $\Delta V$, it is therefore found advantageous to ensure that the capacitance $C_O$ is as high as possible and consequently to ensure that the first insulating layer 1 has a very high capacitance per unit area.

During the second step, the quantity of charges $Q_D$ is reinjected into the detection substrate 3. The quantity of charges which then circulates within the external circuit or in other words between points A and B and ground is written:

$$Q_{ext} = Q_D \cdot \frac{1/C_D}{1/C_O + 1/C_D + 1/C} \simeq Q_D \cdot \frac{C_O}{C_D}.$$

The quantity of charges $Q_{ext}$ is therefore much smaller than the photo-charge $Q_D$. Hence it is also advantageous to have a very high capacitance $C_O$ when carrying out a current readout by measuring $Q_{ext}$.

It was noted earlier that the operation of mosaics in accordance with the invention takes place in two steps. If consideration is given to the example of junction detectors, the junctions are reverse-biased during the first step and are forward-biased during the second step.

Transition of the different elementary detection points from the first to the second step and conversely can take place either sequentially or in parallel, that is, at the same time in the case of all detection points.

FIGS. 4a and 4b show one embodiment of a mosaic in accordance with the invention and a diagram which serves to explain the operation of this latter.

In the case of FIG. 4a, transition from the first to the second step and conversely takes place sequentially by displacement of a quantity of charges at the interface between the read substrate 4 and the oxide layer 5 which covers this latter, within a CCD register which is integrated in the read substrate and the oxide layer which covers said substrate.

In FIG. 4a, the addressing of a single line of the mosaic is shown in a transverse sectional view. In order to simplify the figures, the detection portion is represented schematically by photodiodes d.

A CCD register is therefore integrated in the readout substrate 4 and in the oxide layer 5 which covers said substrate.

The CCD register can be of the surface transfer type or of the volume transfer type and can have two or more phases. Similarly, the creation of potential barriers can be effected by ion implantation or by differences in oxide level.

In the example illustrated in FIG. 4a, the CCD register has two phases $\phi_1$ and $\phi_2$ and the potential barriers are formed by differences in oxide level.

The CCD register shown in FIG. 4a is provided in known manner with two types of electrodes which rest either on the oxide layer 5 or on an additional oxide layer 10. The electrodes e of the second array constitute one electrode out of two of the electrodes which rest on the oxide layer 5. Among the electrodes which rest on the additional layer 10, one electrode out of two is connected to a potential $\phi_1$ and the other electrodes are connected to a potential $\phi_2$. The electrodes which rest on the oxide layer 5 and are not electrodes e of the second array are also connected to the potential $\phi_2$. Depending on the direction of charge transfer indicated by an arrow, these electrodes follow the electrodes located on the layer 10 and connected to $\phi_2$. The potentials $\phi_1$ and $\phi_2$ which are shown in FIGS. 5a and 5b are clock signals having the same period T and substantially in phase opposition with a slight overlap at the top level as is customary practice in the field of CCDs.

The electrodes e are periodically connected (in a manner not shown in the figure) to a constant potential which establishes beneath these electrodes a surface potential of intermediate value between those corresponding to the bottom level and to the top level of the electrode of the following register.

A quantity of charges Q is introduced at the input of the CCD register with a period of the order of the integration time interval $t_i$ and considerably longer than T in accordance with one of the well-known techniques of charge introduction in a CCD, such as the potential-balancing technique, for example. This quantity of charges is then transferred within the CCD from one point to the next in known manner. The surface potential $\phi_S$ within the substrate 4 is shown in FIGS. 4a and 4b when the potential $\phi_1$ is at the top level and then when the potential $\phi_1$ is at the bottom level.

The detection and readout substrates being continuously brought to constant potentials $V_D$ and $V_L$, and when the quantity of charges Q arrives beneath an electrode of the second array e corresponding to an elementary detection point, said quantity causes the charges previously stored at the interface between the detectors and the high-capacitance insulating layer 1 to be reinjected in the detection substrate 3 by capacitive coupling and to recombine within said substrate. When it arrives, the charge Q therefore produces forward-biasing of the detectors.

On the contrary, when said charge Q again leaves an electrode e, it causes reverse-biasing of the detectors.

It is worthy of note that this mode of transition from the first to the second step and conversely by means of an integrated CCD register can be employed only in the case of detectors having pn junctions, Schottky junctions or induced junctions. In the case of pyroelectric detectors which make use of insulating materials such that only bound charges exist in said materials and no free charge is present, this mode of transition from one step to the other is not applicable.

Consideration will now be given by way of example to a number of different modes of reading of the mosaic shown in FIG. 4a.

Figure 7:
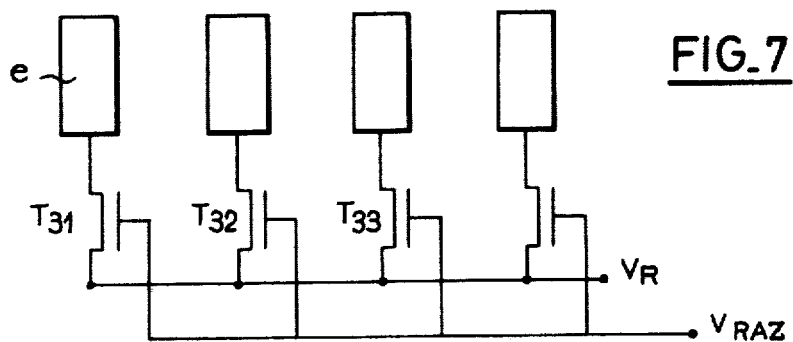

FIGS. 6a, 6b and 7 show one mode of reading of said mosaic, or so-called current readout.

As has already been noted in the description relating to FIG. 3, this mode of reading consists in integrating the current which flows within the detection substrate or readout substrate supply circuit, that is to say for example between point A and ground, between the end of the first step and the beginning of the following first step, and therefore in the case of FIG. 4a between the instant preceding the arrival of the addressing charge beneath an electrode e and the instant followings its departure.

As shown in FIGS. 6a and 6b, there is employed for this purpose an operational amplifier $A_p$ mounted as an integrator with a capacitor $C_R$. The positive input of said amplifier is connected to the voltage of the detection substrate $V_D$. Its negative input is connected to the detection substrate 3.

In FIG. 6a, the capacitor $C_R$ is short-circuited after each current readout by an MOS transistor $T_1$ which is mounted in parallel with said capacitor. A periodic signal $V_{RAZ}$ which is shown in FIG. 5c is applied to the gate of said transistor $T_1$. The signal $V_{RAZ}$ has a period equal to T and is present at the top level whereas $\phi_1$ is at the bottom level. The disadvantage of the embodiment shown in FIG. 6a lies in the fact that the transistor $T_1$ constitutes a source of noise which may interfere with current readout.

In the embodiment shown in FIG. 6b, the source of noise mentioned above is suppressed. In this embodiment, a transistor $T_2$ controlled by the signal $V_{RAZ}$ is mounted between a point D and a constant voltage $V_C$, this point D being separated from the output of the operational amplifier by a coupling capacitor $C_L$. Thus, after each current readout, the output of the readout device is brought to a continuous reference level.

In the case of FIGS. 6a and 6b, the output of the readout device can be followed by a conventional sampling and holding circuit which makes it possible to obtain a continuous video signal at the output.

FIG. 7 illustrates an improvement which can be made in the mode of current readout illustrated in FIGS. 6a and 6b. Each electrode of the second array e can be brought periodically to a reference potential $V_R$ by MOS transistors $T_{31}$, $T_{32}$, $T_{33}$ ... which are connected on the one hand to an electrode e and on the other hand to the voltage $V_R$ and to which is applied a periodic signal having a period T. This periodic signal triggers the transistors $T_{31}$, $T_{32}$, $T_{33}$ into conduction when the phase $\phi_2$ is at the top level or in other words during the first step in which integration of the photo-charges takes place in the detectors. The signal $V_{RAZ}$ can be employed for this purpose. Since the potential of the electrodes e is substantially constant during the integration time interval $t_i$, it is thus possible to store a greater quantity of charges in respect of the same initial bias voltage applied to the detectors while preventing saturation; the integration time interval $t_i$ can thus be increased.

The MOS transistors employed in the readout device can be integrated in the semiconductor readout substrate 4 which is already employed for the CCD register.

Figure 8:
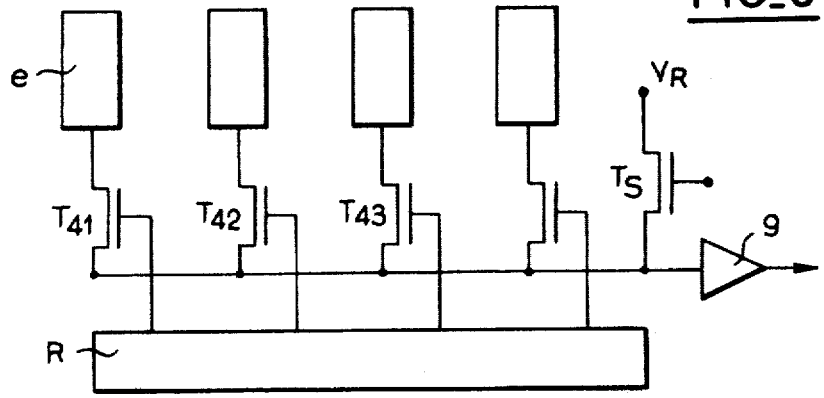

FIG. 8 illustrates a mode of reading known as voltage readout of the mosaic which is shown in FIG. 4a.

Each output of an address register having multiple outputs R is connected to the gate of an MOS transistor $T_{41}$, $T_{42}$, $T_{43}$ .... Each MOS transistor is connected between one electrode of the second array e and an output preamplifier 9. The address register R and the transistors $T_{41}$, $T_{42}$, $T_{43}$ ... can be integrated in the readout substrate 4. When the address register addresses one of its outputs, there is obtained at the output of the preamplifier 9 the voltage on the electrode e to which said input is connected via an MOS transistor.

It is possible to measure the difference in voltages on each electrode e between the beginning of the first step and the end of the first step or in other words during the integration time interval $t_i$. In this case, the address register R having multiple outputs initiates conduction of the MOS transistor which is connected to the electrode e to be read between the instant following departure of the quantity of addressing charges and the instant preceding transfer of the following quantity of addressing charges. A sampling and holding circuit is usually connected to the preamplifier 9. The integration time interval $t_i$ can be adjusted by varying the instant of addressing by the register R of the electrode e which is read.

It is also possible to measure the difference in voltages on each electrode e between the end of the first step and the beginning of the following first step. In this case also, the address register having multiple outputs R must initiate conduction of the MOS transistor which is connected to the electrode e to be read between the instant preceding transfer of the quantity of addressing charges and the instant which follows departure of this quantity of charges. In this case, the voltage readout time is distinctly shorter than the integration time interval $t_i$, thus permitting the advantageous possibility of reducing the influence of noise, low-frequency variations or drift.

An MOS transistor $T_S$ connected between the input of the preamplifier 9 and the reference voltage $V_R$ makes it possible to bring each electrode e to the reference voltage $V_R$ immediately after reading of said electrode.

Figure 9:
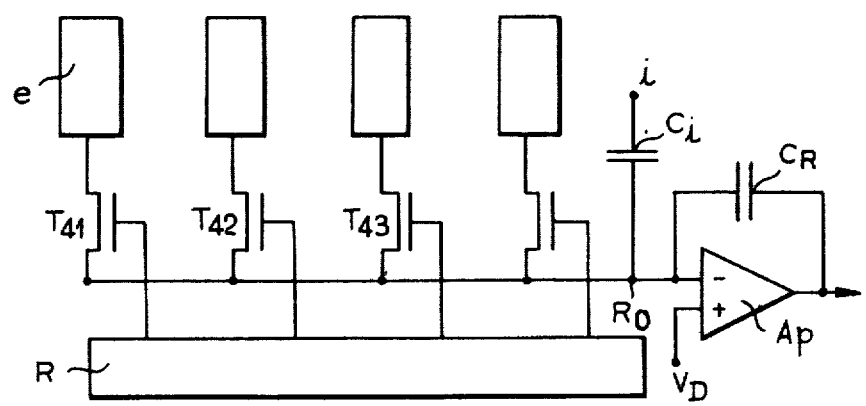
FIGS. 9 and 10 illustrate two further embodiments of a mosaic in accordance with the invention.

FIG. 9 shows another embodiment of a mosaic in accordance with the invention.

The transition from the first to the second step and conversely takes place sequentially and no longer through a CCD register but simply through an address register having multiple outputs R. Each output is connected to the gate of an MOS transistor $T_{41}$, $T_{42}$, $T_{43}$ ... which is connected between one of the electrodes e of the second array and a common point $R_o$ to which a pulse i is applied periodically via a capacitor $C_i$, thus initiating changeover from one step to the next of the detectors which receive said pulse.

The detection substrate 3 and the readout substrate 4 are brought continuously to constant potentials $V_D$ and $V_L$.

Current readout of the electrodes e can be performed by employing an operational amplifier $A_p$ mounted as an integrator with a capacitor $C_R$, as in the case of FIGS. 6a and 6b.

Current readout may be carried out as in the case of FIGS. 6a and 6b by integrating the current which flows within the bias circuit of the detection substrate between the end of the first step and the beginning of the following first step. It is also possible to integrate the development of current flow within the bias circuit which is connected to the electrodes, that is, to the output of the amplifier $A_p$.

Voltage readout can also be performed in the manner explained in the description relating to FIG. 8. The readout device thus provided is more simple and the device obtained in the case in which the transition from one state to another takes place by means of a CCD register but does not make it possible to obtain an adjustable integration time interval $t_i$ as was the case with the CCD register.

Figure 10:
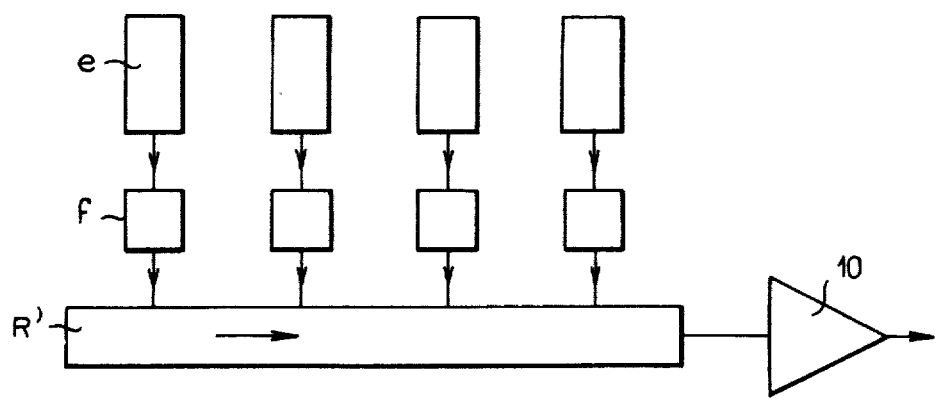

The transition from the first to the second step and conversely can also take place in parallel or in other words at the same time in the case of all the detectors. This result can be obtained by modifying the bias of the detection and readout substrates or by modifying the bias of the electrodes e of the second array which are connected in parallel. In the case of pyroelectric detectors, it is possible to employ only variable biasing of the electrodes e of the second array. FIG. 10 shows another embodiment of a mosaic in accordance with the invention in which the transition from one step to the other takes place in parallel. There is employed in this case a CCD register R' which carries out a lateral transfer in the direction indicated by an arrow in the figure, of the quantities of charges corresponding to the readout performed at the same instant on the electrodes e. This CCD register therefore carries out a multiplexed readout of the detectors of one line of the mosaic. A preamplifier 10 is connected to this register. The register R' and the preamplifier 10 can be integrated in the readout substrate. Between each electrode e of the second array and one input of the CCD register is interposed a device f which carries out conversion of the voltage on each electrode e to charges which can be introduced into the CCD. In fact, during the integration time interval $t_i$, the electrodes e are floating or in other words are not connected to any bias voltage. Their potential therefore undergoes a progressive variation and it is the measurement of this progressive variation in the voltage on the electrodes e during the integration time interval which constitutes the readout signal of the mosaic. Conversion of the voltage on the electrodes e to charges within the CCD register can be carried out in different known ways and especially by the method of balancing of potentials which is described in the IEEE Journal of Solid State Circuits, volume SC 10, No 2, April 1975.

What is claimed is:

1. A mosaic of radiation detectors read by a semiconductor device, comprising an array of detectors which are exposed to the radiation and each deliver an electrical signal, said array being formed on a substrate so arranged as to be separate and distinct from a semiconductor readout substrate used to read said array and which is covered with an oxide layer, a first insulating layer having high capacitance per unit area separates the surface of the mosaic on which the detectors are formed from the oxide layer which covers said semiconductor readout substrate, and a first array of metallic electrodes collect by capacitive coupling the electrical signals delivered by the detectors at the surface of the first insulating layer on the side corresponding to the readout device.

2. A mosaic according to claim 1, wherein said mosaic comprises a second array of metallic electrodes separated from the first array by a second insulating layer and located at the interface between said second insulating layer and the oxide layer, each electrode of the second array being connected electrically to one electrode of the first array which is located opposite and has greater dimensions.

3. A mosaic according to claim 2, wherein a metallic screen brought to a fixed potential is inserted in the second insulating layer.

4. A mosaic according to claim 2, wherein the detectors are pn or Schottky junctions having a mesa or planar structure and formed on a semiconductor substrate.

5. A mosaic according to claim 4, including means for the semiconductor readout device to carry out successively in the case of each junction:

during a first step, reverse-biasing of said junction during which integration of the radiation received by the junction takes place;

during a second step, forward-biasing of said junction.

6. A mosaic according to claim 2, wherein the detectors are of pyroelectric material.

7. A mosaic according to claim 6 includes means for the semiconductor readout device to carry out successively:

during a first step, integration of the radiation received by each detector of pyroelectric material which is allowed to remain at a floating potential;

during a second step, the operation whereby the potential which has previously been allowed to remain floating is stabilized at a reference potential.

8. A mosaic according to claim 2, wherein said mosaic is constituted by a strip of pyroelectric material.

9. A mosaic according to claim 8, including means for the semiconductor readout device to carry out successively:

during a first step, integration of the radiation received by the strip of pyroelectric material which is allowed to remain at a floating potential;

during a second step, the operation whereby the potential which has previously been allowed to remain floating is stabilized at a reference potential.

10. A mosaic according to claim 2, wherein the first insulating layer is a vacuum layer.

11. A mosaic according to claim 2, wherein the first insulating layer is a plastic dielectric layer.

12. A mosaic according to claim 5 or claim 7 or claim 9, includes means for the readout device to carry out a current readout by integrating the current which flows within the bias circuit of the detection substrate or of the readout substrate which are continuously brought to a constant potential between the end of the first step and the beginning of the following first step.

13. A mosaic according to claim 5 or claim 7 or claim 9, includes means for the readout device to carry out voltage readout by measuring the difference in voltages on each electrode during the integration time interval between the beginning of the first step and the end of said first step.

14. A mosaic according to claim 5, including means for the readout device to carry out voltage readout by measuring the difference in voltages on each electrode between the end of the first step and the beginning of the following first step.

15. A mosaic according to claim 5, wherein transition from the first to the second step and conversely takes place sequentially by shifting a quantity of charges at the interface between the readout substrate and the oxide layer which covers said substrate within a CCD register integrated in the readout device.

16. A mosaic according to claim 5 or claim 7 or claim 9, wherein transition from the first to the second step and conversely takes place sequentially by means of an address register having a plurality of separately addressable outputs, each output being connected to the gate of an MOS transistor connected between one of the electrodes of the second array and a common point to which a pulse is periodically applied so as to initiate transition of the electrodes which receive said pulse from one step to the next.

17. A mosaic according to claim 13, comprising a charge-coupled device integrated in the semiconductor readout substrate ensures that the voltage representing the readout is converted to charges.

* * * * *